United States Patent [19]

Wambsgannss et al.

[11] 4,140,933
[45] Feb. 20, 1979

[54] ARRANGEMENT FOR SLIPRING-FREE MEASUREMENT OF ROTOR CURRENT OF AN ELECTRICAL MACHINE

[75] Inventors: Heinrich Wambsgannss, Mannheim; Franz Heinen, Heidelberg, both of Fed. Rep. of Germany

[73] Assignee: BBC Brown Boveri & Company Limited, Baden, Switzerland

[21] Appl. No.: 785,949

[22] Filed: Apr. 8, 1977

[30] Foreign Application Priority Data

Apr. 10, 1976 [DE] Fed. Rep. of Germany ....... 2615803

[51] Int. Cl.² .......................................... H02K 11/00
[52] U.S. Cl. .................................. 310/68 R; 310/72; 310/168; 324/158 MG; 324/51
[58] Field of Search ........................ 324/51, 158 MG; 310/68 R, 68 B, 68 D, 71, 72, 168, 111, 179, 15

[56] References Cited

U.S. PATENT DOCUMENTS

| | | | |
|---|---|---|---|
| 1,522,196 | 1/1925 | MacMillan | 324/158 MG UX |
| 1,836,882 | 12/1931 | Nilsson-Stig | 310/179 |
| 2,640,100 | 5/1953 | Packer et al. | 324/158 MG |
| 2,794,136 | 5/1957 | Kalikow et al. | 310/68 C |
| 3,133,214 | 5/1964 | Lawson et al. | 310/15 |
| 3,624,504 | 11/1971 | Joly | 324/158 MG |
| 3,855,529 | 12/1974 | Langweiler | 324/158 MG |
| 3,867,657 | 2/1975 | Vates et al. | 310/72 X |

FOREIGN PATENT DOCUMENTS

1288679   2/1969   Fed. Rep. of Germany ... 324/158 MG

Primary Examiner—Donovan F. Duggan
Attorney, Agent, or Firm—Burns, Doane, Swecker & Mathis

[57] ABSTRACT

Measurement of the current flowing in the rotor of an electrical machine and especially an a.c. exciter with external poles for excitation of a synchronous machine by way of a rectifier mounted on the rotor is accomplished without the use of sliprings by means of at least one pair of contra-wound coils extending in the axial direction of the rotor, the coils being connected in series and mounted in a slotted support of insulation material secured to the underface of a pole shoe in the gap between shoe and a toothed rotor. A voltage proportional to the rotor current is induced in the pair of coils by the stray flux generated by the current carrying conductors in the rotor slots. The width of each coil approximates the width of one tooth on the rotor and the spacing between the axes of the coils approximates the size of the rotor slot pitch.

8 Claims, 3 Drawing Figures

ARRANGEMENT FOR SLIPRING-FREE MEASUREMENT OF ROTOR CURRENT OF AN ELECTRICAL MACHINE

BACKGROUND OF THE INVENTION

The invention concerns an arrangement for a slipring-free measurement of the current flowing in the conductors of the rotor component of an electric machine, especially the rotor current of an a.c. exciter with external poles for the excitation of a synchronous machine energized by way of rotating rectifier elements, with a sending unit in the rotating part and a receiving unit in the stationary part of the machine. Such an arrangement is known, for example, in view of published German application DT-AS 1 080 221.

Arrangements of this type are needed to measure the excitation current of brushless synchronous machines. Since the excitation current is generated in a rotating armature of an a.c. exciter, it would either be necessary to transfer, for the purpose of measurement, the excitation current by way of slip-rings from the rotating part of the machine to the stationary part and then to return it, or to produce across a resistor a voltage drop that is proportional to the current and to transfer this measured value by way of slip-rings to the stationary part. A relatively accurate measurement of the excitation current is needed, for example, in order to determine the temperature rise within the excitation winding.

However, the use of slip-rings in measuring circuits not only causes measuring errors but is also undesirable because of the required service maintenance. The above mentioned known arrangement provides at the rotating body of the exciter armature an additional magnetic system through which flows the excitation current generated within the exciter armature and which is faced by an additional, stationary winding where a voltage is induced that is proportional to the current flowing through the rotating magnetic system. However, the additional magnetic system and the additional stationary winding will increase the axial dimensions of the exciter and thus the overall length of the turboset, leading to a — practically always disadvantageous — lowering of the critical bending speed, and increasing also the construction costs, for example, for the power station building.

SUMMARY OF THE INVENTION

It is therefore the principle object of the invention to establish an arrangement of the above specified general type where the technical cost outlay is reduced and where especially the axial dimensions of the rotor need not be increased in comparison with exciter arrangements without devices for such current measurements.

The invention solves this problem for the above defined arrangement in that manner that the excitation current conductors, located $_n$. slots provided at the periphery of the rotor, serve as a "transmitting" unit for the rotor current and that at least two measuring coils, which extend in the axial direction of the rotor below at least one of the pole shoes, face the rotor of the exciter with external poles, are contra-wound and connected in series, serve as a current "receiving" unit, their width corresponding approximately to the tooth width of the rotor teeth, where the spacing between the axes of the two coils corresponds approximately to the size of the rotor slot pitch $\tau n$. In the case of the arrangement proposed by the invention, where the teeth and slots of the rotor rotate past, and opposite to, the poleshoe, a voltage is induced in the measuring coils by the (stray-) flux $\phi$ generated by the current-carrying conductors located within the slots of the rotor and which envelops tightly these conductors. This voltage serves as a measurement for the current flowing within the conductors.

The current which flows during passage of a specific geometric point on the circumference of the rotor within the conductor rotating past this point will always have the same magnitude even though the exciter delivers an alternating current or — in case of successively-connected converters — a square-wave current.

The magnetic circuit comprises, in the case of the arrangement proposed by the invention, always the same number of slot flow-throughs so that only the fluctuations of the magnetic linkage of the flux produced by the slot flow-through with the measuring coil can induce a measuring voltage in the coil. This will guarantee an unambiguous relationship between the measuring voltage and the current flowing through the conductors within the rotor slots.

The arrangement of the invention offers primarily the specific advantage that the full phase current flows under the pole shoe (in contrast to the pole gap where there is no current flow in the case of a non-chorded winding with converter loading). Therefore, only a relatively small number of windings are needed for the measuring coil in order to obtain a usable measuring voltage.

In the case of one embodiment of the invention it is specified that the number of measuring coils is a multiple of two, and that in each case two measuring coils are arranged below the pole shoes of different poles. This makes it possible to compensate the influence of shaft vibrations in the radial direction.

Another embodiment of the invention provides that the number of measuring coils per pole is a multiple of two, and that the measuring coils in each case are displaced relative to each other by a whole number multiple of the rotor slot pitch. This will result in an increase of the induced voltage, substantially proportional to the current.

The measuring coils can be placed in an advantageous manner within the recesses of the pole shoe. This specific arrangement is particularly sturdy in mechanical respect but requires an additional machining of the pole shoes.

A preferred embodiment of the invention provides that the measuring coils are arranged below the pole shoes within the air gap in recesses of a support consisting of a non-metallic material. The measuring coils can, in this case, be bonded to the recesses by covering them with a casting resin. The support accommodating the measuring coils can be fastened to the underside of the pole shoe most suitably by adhesive means. These embodiments of the invention make unnecessary any additional machining of the pole shoes and they will also facilitate any maintenance work which may be required. This arrangement can furthermore be installed in a previously assembled machine.

BRIEF DESCRIPTION OF THE DRAWINGS

Other details and advantageous further developments of the invention are disclosed by the practical examples, described below and illustrated by the accompanying drawings, wherein.

Figure 1:
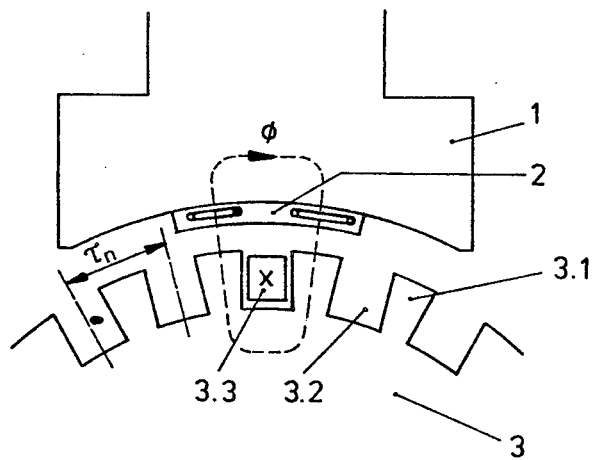
FIG. 1 shows one sectional area of a measuring device installed below a pole shoe of the exciter machine.
Figure 2:
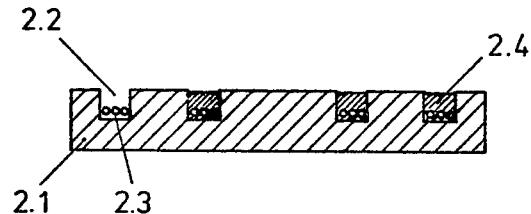
FIG. 2 shows a cross section through a support used for the measuring device with coils inserted therein.

In these figures the pole shoe of the machine is denoted by numeral 1 and the measuring device by numeral 2. The device consists of a non-metallic support 2.1, made for example from a glassfiber-reinforced synthetic resin, with pairs of recesses 2.2 machined into it. Each pair of these recesses 2.2, accommodates a measuring coil 2.3, and the recesses of each pair are spaced apart by a distance which corresponds substantially to the width of one tooth on the rotor. The conductors of the two measuring coils which are contra-wound are inserted respectively in the two pairs of recesses and connected in series. The upper portion of each recess 2.2 is filled with a pourable mass 2.4, for example, a casting resin. In the example illustrated, these recesses face the pole shoe. The distance between the axes of two paired coils corresponds to the size of the rotor slot pitch $\tau_n$. The support 2.1 is affixed to the underface of the pole shoe by means of a suitable adhesive.

Numeral 3 denotes the rotor of the machine into which there are machined the slots 3.2, with the teeth 3.1 left between them. The rotor winding 3.3 is inserted into the slots 3.2.

Figure 3:
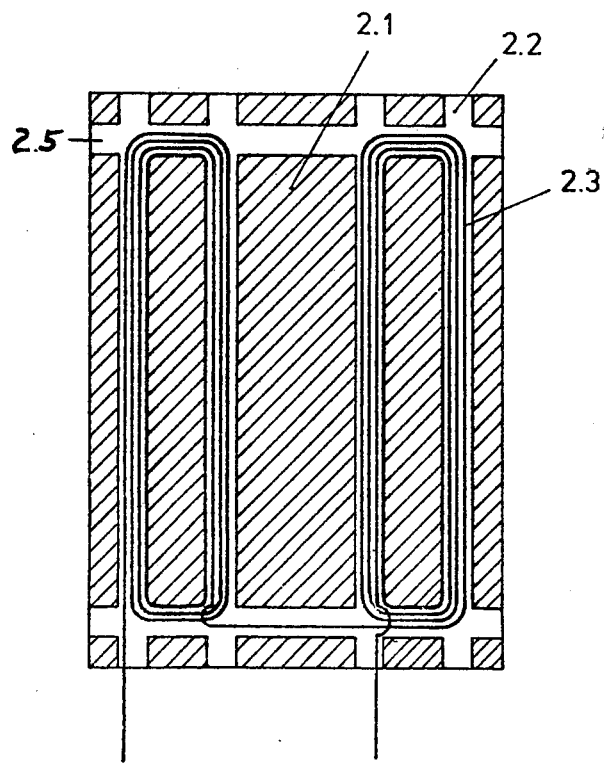
FIG. 3 shows a top view of the support illustrated in FIG. 2.

FIG. 3 shows that the end turn and interconnection portions of the pair of measuring coils 2.3 is accommodated in additional recesses 2.5 of the support 2.1 which run in a circumferential direction. The conductors which make up the winding of the measuring coil 2.3 need not extend over the entire length of the pole shoe 1. A relatively small conductor cross-section of the measuring winding will be sufficient and the measuring coil can therefor be kept very narrow.

We claim:

1. A slipring-free arrangement for measuring the current flowing in the rotor winding of an a.c. exciter having a rotor with teeth defining slots therein, current carrying conductors disposed in the slots and external pole shoes, for the excitation of a synchronous electrical machine which is energized by means fo rotatable rectifier elements, comprising:

a pair of measuring coils extending in the axial direction of the rotor and mounted to the underside of at least one pole shoe facing the rotor of an exciter, whereby a voltage porportional to the current flowing in the rotor winding is induced in said measuring coils by the stray flux generated by the current carrying conductors; said measuring coils being wound in opposite directions and connected to each other in series; the width of each of said measuring coils being approximately equal to the width of one rotor tooth and the spacing between the central axes of the measuring coils being approximately equal to the distance of the rotor slot pitch.

2. A slipring-free arrangement for measuring rotor current as defined in claim 9 wherein the two measuring coils of said pair are correlated with different pole shoes having different polarities.

3. A slipring-free arrangement for measuring rotor current as defined in claim 1, wherein the number of measuring coils per pole is a multiple of two and that said coils are displaced relative to each other by a whole multiple of one rotor slot pitch.

4. A slipring-free arrangement for measuring rotor current as defined in claim 1 wherein said coils are mounted in recesses provided in the underface of a pole shoe.

5. A slipring-free arrangement for measuring rotor current as defined in claim 1 wherein said coils are mounted in recesses provided in a support of non-metallic material secured to the underface of a pole shoe.

6. A slipring-free arrangement for measuring rotor current as defined in claim 5 wherein said coil support is secured to the underface of a pole shoe by an adhesive.

7. A slipring-free arrangement for measuring rotor current as defined in claim 5 wherein said coil support is made from a glassfiber-reinforced synthetic resin.

8. A slipring-free arrangement for measuring rotor current as defined in claim 5 wherein said coils are embedded in the recesses provided in said support by means of casting resin.

* * * * *